United States Patent
Iizuka

(10) Patent No.: US 7,782,671 B2
(45) Date of Patent: Aug. 24, 2010

(54) SEMICONDUCTOR DEVICE AND METHOD OF MANUFACTURING THE SAME

(75) Inventor: Hirohisa Iizuka, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 12/187,678

(22) Filed: Aug. 7, 2008

(65) Prior Publication Data

US 2009/0040824 A1 Feb. 12, 2009

(30) Foreign Application Priority Data

Aug. 10, 2007 (JP) .............................. 2007-209869

(51) Int. Cl.
*G11C 11/34* (2006.01)

(52) U.S. Cl. .............................. 365/185.05; 365/185.24

(58) Field of Classification Search ............ 365/185.05, 365/185.24

See application file for complete search history.

(56) References Cited

U.S. PATENT DOCUMENTS

| 5,214,496 | A * | 5/1993 | Sunami et al. ............... 257/296 |
| 6,495,870 | B1 | 12/2002 | Sekiguchi et al. |
| 7,105,873 | B2 | 9/2006 | Sekiguchi et al. |
| 2006/0209585 | A1* | 9/2006 | Tanizaki et al. ............. 365/148 |
| 2007/0091670 | A1* | 4/2007 | Hidaka ........................ 365/158 |
| 2007/0091671 | A1* | 4/2007 | Ooishi et al. ................. 365/158 |

* cited by examiner

*Primary Examiner*—Michael T Tran
(74) *Attorney, Agent, or Firm*—Oblon, Spivak, McClelland, Maier & Neustadt, L.L.P.

(57) ABSTRACT

A semiconductor device includes a plurality of a word lines. The word lines have a set of odd word lines and a set of even word lines. The odd and the even word lines are located from a first end region to a second end region through the cell region located between the first and the second end regions. The odd word lines are divided in the first end region and the even word lines are divided in the second end region to form dummy word line portions.

9 Claims, 7 Drawing Sheets

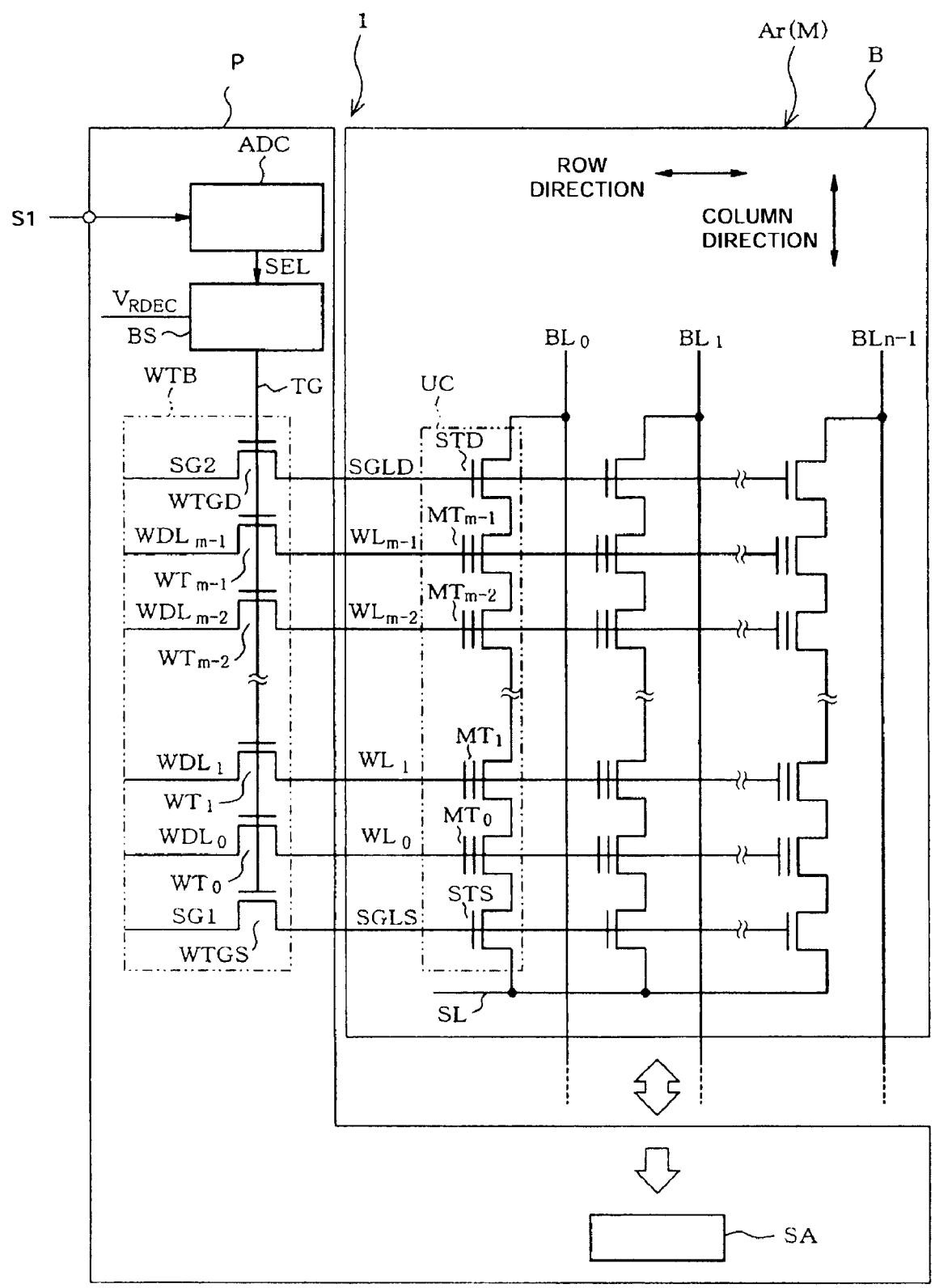
F I G. 1

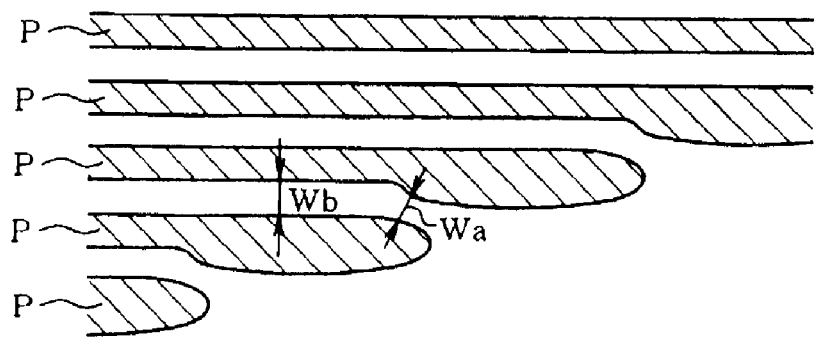
F I G. 5
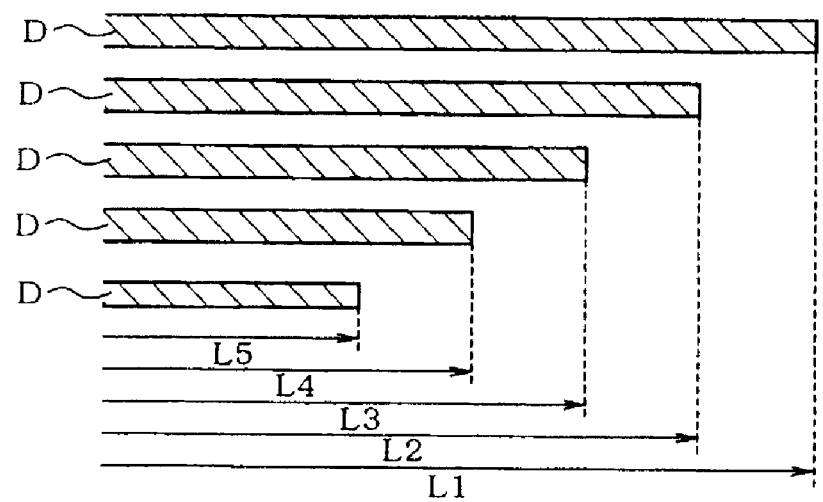
F I G. 6
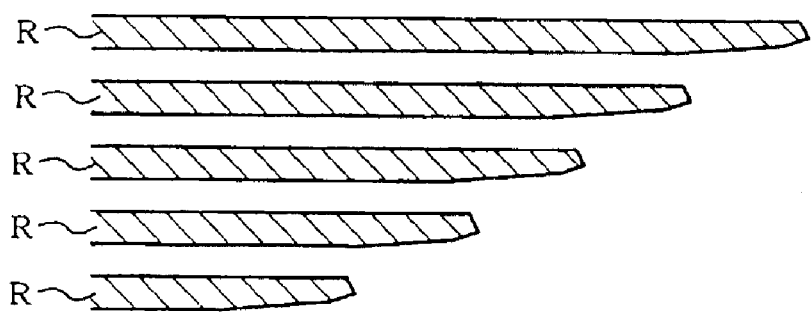
F I G. 7

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2007-209869, filed Aug. 10, 2007, the entire contents of which are incorporated herein by reference.

BACKGROUND OF THE INVENTION

1. Field of the Invention

This invention relates to a semiconductor device and a method of manufacturing the same and, more particularly, to a memory device having a plurality of word lines arranged at extremely narrow pitches.

2. Description of the Related Art

The semiconductor memory device, such as a NAND-type flash memory which is used as a data storage cell for multimedia card, has a plurality of bit lines and a plurality of word lines which intersect the bit lines in a memory cell area. A contact area is located in an end portion of each word line. A predetermined voltage is supplied through the contact area to each word line. The contact area (the end portions) is arranged so that each may shift in an extending direction of the word line. By this arrangement, an interference effect of a diffracted light in the end portions are reduced when the word lines are patterning, and short or disconnect of the word lines are prevented.

However, with a reduction of a design rule of the NAND flash memory, distance between the word lines becomes narrower. By the reduction, even if the end portions are shifted, an influence of a leak current between the word lines increases when a potential difference between the adjacent word lines.

BRIEF SUMMARY OF THE INVENTION

According to a first aspect of the present invention, there is provided a semiconductor device comprising a semiconductor substrate including a first and a second end regions, and a cell region located between the first and the second end regions, the cell region including the memory cell transistors; a first word line located from the first end region to the second end region through the cell region along a predetermined direction, the first word line including a first main word line portion located from the cell region to the first end region and a first dummy word line portion located in the second end region along an extension direction of the first main word line portion, a first end of the first dummy word line portion located near a second end of the first main word line portion via a first dividing portion located in the second end region; a second word line located adjacent to the first word line from the first end region to the second end region through the cell region in parallel with the first word line, the second word line including a second main word line portion located from the cell region to the second end region and a second dummy word line portion located in the first end region along an extension direction of the second main word line portion, a third end of the second dummy word line located adjacent to a fourth end of the second main word line portion via a second dividing portion located in the first end region; a first contact located in the first end region and electrically connected to the first main word line portion; and a second contact located in the second end region and electrically connected to the second main word line portion.

According to a second aspect of the present invention, there is provided a manufacturing method of a semiconductor device comprising forming an actual word line pattern having a set of odd word lines and a set of even word lines, the odd and the even word lines located from a first end region to a second end region through the cell region located between the first and the second end regions; and dividing the odd word lines in the first end region and the even word lines in the second end region to form dummy word lines.

According to a third aspect of the present invention, there is provided a manufacturing method of a semiconductor device comprising preparing a design pattern including a plurality of word line patterns having a set of odd word line patterns and a set of even word line patterns, each word line pattern including a rectangular shape, one end of the odd word line patterns located between the even word line patterns, the other end of the odd word line patterns located outward from one end of the even word line patterns, the one end of the even word line patterns located between the odd word line patterns, and the other end of the even word line patterns located outward from the one end of the odd word line patterns; forming a resist pattern with the design pattern including first portions corresponding to the other end of the odd and the even word line patterns and second portions corresponding to the one end of the odd and the even word line patterns, a width of the first portions being narrower than a width of the second portions; forming an actual pattern with the resist pattern by reactive ion etching process, the actual pattern including a plurality of actual word lines having first end portions corresponding to the first portions of the resist pattern and second end portions corresponding to the second portions of the resist pattern, a width of the first end portions being wider than a width of the second end portions, and dividing each of the actual word lines to form dummy word lines located adjacent to the first end portions.

BRIEF DESCRIPTION OF THE SEVERAL VIEWS OF THE DRAWING

FIG. 1 is a block diagram showing an example of the configuration of a NAND flash memory according to a first embodiment.

FIG. 5 is a plan view showing an actual final configuration of a line and space pattern made experimentally.

FIG. 6 is a plan view showing a design pattern corresponding to the line and space pattern shown in FIG. 5.

FIG. 7 is a plan view showing a resist pattern corresponding to the design pattern shown in FIG. 6.

DETAILED DESCRIPTION OF THE INVENTION

Figure 2:
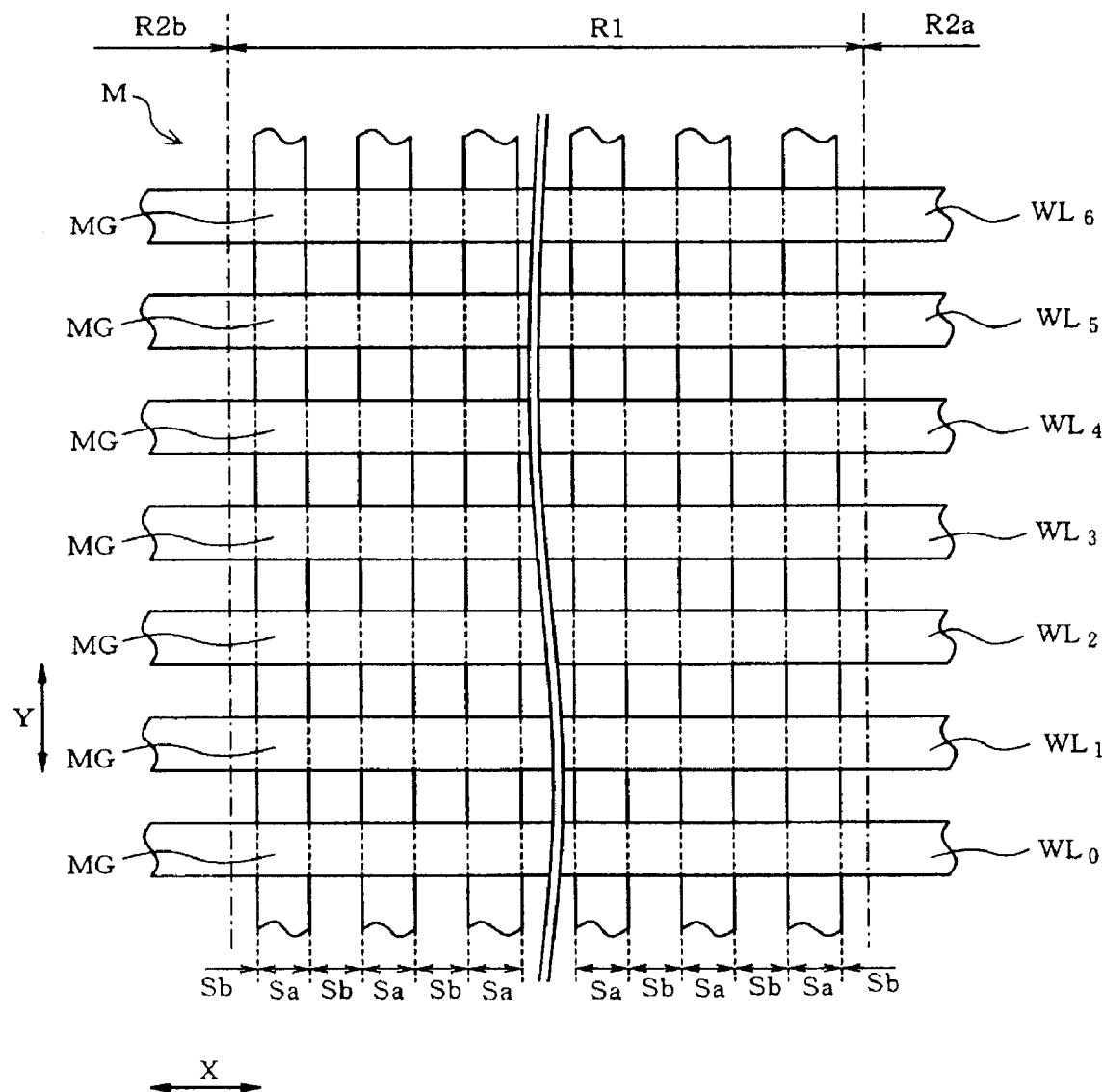
FIG. 2 is a plan view showing an example of the structure of a memory cell array shown in FIG. 1.

Embodiments of the present invention will be described with reference to the accompanying drawings. It should be noted that the drawings are schematic ones and the dimension ratios shown therein are different from the actual ones. The dimensions vary from drawing to drawing and so do the ratios of the dimensions. The following embodiments are directed to a device and a method for embodying the technical concept of the present invention and the technical concept does not specify the material, shape, structure or configuration of components of the present invention. Various changes and modifications can be made to the technical concept without departing from the spirit or scope of the claimed invention.

First Embodiment

FIG. 1 shows an example of the configuration of a semiconductor device according to a first embodiment of this invention. In the present embodiment, a case wherein a NAND-type flash memory is applied to a nonvolatile memory device as an example is explained.

In FIG. 1, the NAND-type flash memory 1 has a memory cell region M and a peripheral circuit region P. A memory cell array Ar is located in the memory cell region M. The memory cell array Ar has a plurality of cell units UC. The cell units UC are arranged in the shape of a matrix along a row direction and a column direction which intersects the row direction. In FIG. 1, the cell units UC which are arranged in parallel with the column direction constitutes a memory block B. A plurality of memory blocks B are located along the row direction (not shown).

Each cell unit UC has a first select gate transistor STD which is connected to one of bit lines BL0 to BLn-1, a second select gate transistor STS which is connected to a source line SL and a plurality of memory cell transistors MT0 to MT0-1 located between select gate transistors STD and STS. Each of the bit lines BL0 to BLn-1 extends along the row direction. The memory cell transistors MT0 to MT0-1 are located along the row direction and connected in series by sharing a source and a drain. A drain of the select gate transistor STS is shared with the source of the memory cell transistor MT0. A source of the select gate transistor STS is connected to the source line SL. A source of the select gate transistor STD is shared with the drain of the memory cell transistor MT0-1. A drain of the select gate transistor STD is connected to the bit line BL0.

A select line SGLD, a select line SGLS and a plurality of word lines WL0 to WLm-1 are located along the column direction in the memory cell array Ar. The select line SGLD is connected to the select gate transistors STD which are connected to the bit lines BL0 to BLn-1, respectively. The select line SGLS is connected to the select gate transistors STS which are connected to the bit lines BL0 to BLn-1, respectively. The word line WL0 is connected to the memory cell transistors MT0 which are connected to the bit lines BL0 to BLn-1, respectively. The word lines WL1 to WLm-1 are connected to the memory cell transistors MT1 to MT0-1 likewise. The select line SGLD, SGLS and the word lines WL0 to WLm-1 function as gate electrodes, respectively.

The peripheral circuit region P has a plurality of peripheral circuits. The peripheral circuits have a sense amplifier circuit SA, an address decoder circuit ADC, a charge pump circuit BS and a transfer circuit WTB.

The sense amplifier circuit SA is connected to the bit lines BL0 to BLn-1. The address decoder circuit ADC selects one of the memory blocks B according to an external address signal S1. The address decoder circuit ADC supplies the select signal SEL to the charge pump circuit BS. The charge pump circuit BS receives an external power source V1. The charge pump circuit BS boosts the external power source V1. The charge pump circuit BS supplies the boosted power source to the transfer circuit WTB through a transfer gate line TG.

The transfer circuit WTB has a transfer gate transistor WTGD corresponding to the select gate transistor STD, a transfer gate transistor WTGS corresponding to the select gate transistor STS and transfer gate transistors WT0 to WTm-1 corresponding to the memory cell transistors MT0 to MT0-1, respectively. The transfer gate line TG functions as a control gate of the transfer gate transistor WTGD, WTGS and WT0 to WTm-1. One of a source/drain of the transfer gate transistor WTGD is connected to a drive line SG2 and the other of the source/drain of the transfer gate transistor WTGD is connected to the select line SGLD. One of a source/drain of the transfer gate transistor WTGS is connected to a drive line SG1 and the other of the source/drain of the transfer gate transistor WTGS is connected to the select line SGLS. One of a source/drain of the transfer gate transistor WT0 is connected to a drive line WDL0 and the other of the source/drain of the transfer gate transistor WT0 is connected to the word line WL0. One of a source/drain of the transfer gate transistor WT1 to WTm-1 are connected to a drive line WDL1 to WDLm-1 and the other of the source/drain of the transfer gate transistor WT1 to WTm-1 are connected to the word line WL1 to WLm-1, respectively.

FIG. 2 is a schematic plan view showing a layout pattern of part of a cell region R1 which is located between a pair of end regions R2a, R2b in the memory cell region M. In the cell region R1, a plurality of active area Sa are located along a direction Y (row direction) in parallel, and a plurality of element isolation regions Sb are located between the active area Sa. A silicon oxide film is embedded in the element isolation regions Sb as an element isolation insulating film. The word lines WL0 to WL6 are located over the active area Sa and the element isolation regions Sb along a direction X (column direction) in parallel. Each word line WL has a pair of end portions. One end portion of the word line WL is located in the end region R2a and the other end portion of the word line WL is located in the end region R2b. A plurality of gate electrodes MG of the memory cell transistors is located between the active area Sa and the word lines WL.

Figure 3:
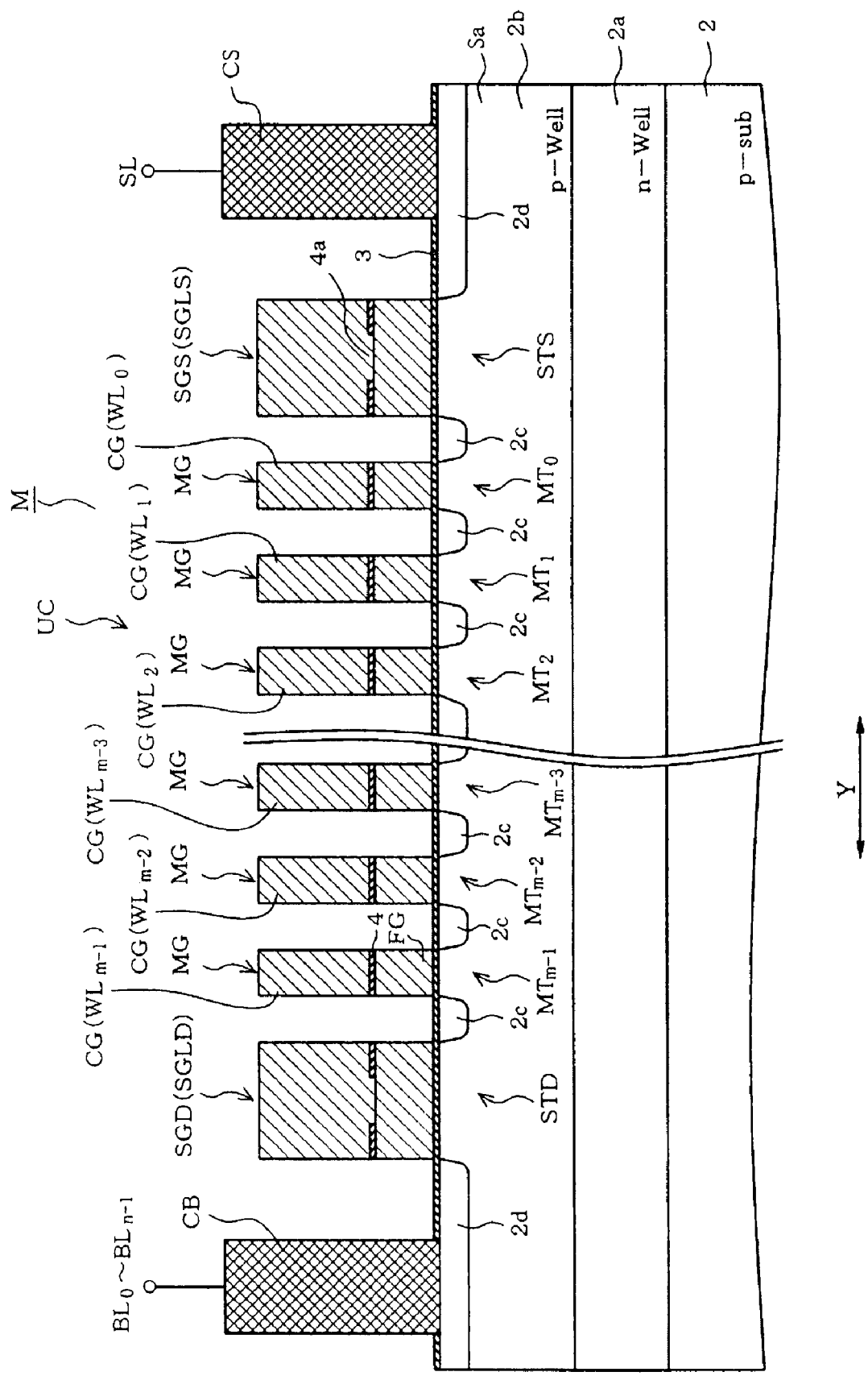
FIG. 3 is a cross-sectional view showing an example of the structure of a memory cell array shown in FIG. 1.

FIG. 3 is a cross-sectional view of the memory cell unit UC along the row direction. A p-type semiconductor substrate 2 has a p-type well region 2b at a surface of the semiconductor substrate 2 and an n-type well region 2a located below the p-type well region 2b. The select gate transistors STD, STS and the memory cell transistors MT0 to MT0-1 are formed at the p-type well region 2b.

A gate insulating film 3 is formed on the semiconductor substrate 2 in the p-type well region 2b. A select gate electrode SGD of the select gate transistor STD and a select gate electrode SGS of the select gate transistor SGS are formed on the gate insulating film 3. Memory cell electrodes MG are formed on the gate insulating film 3 in the row direction between the select gate electrodes SGD, SGS. Each memory cell electrode MG has a floating gate electrode FG formed on the gate insulating film 3, an inter-gate insulating film 4 formed on the floating gate electrode FG and a control gate electrode CG formed on the inter-gate insulating film 4. The gate insulating film 3 has a silicon oxide film. The floating gate electrode FG has a polycrystalline silicon film in which an impurity such as a phosphorus is doped. The inter-gate insulating film 4 has a pair of silicon oxide films and a silicon nitride film located between the silicon oxide films. The control gate electrode CG has a polycrystalline silicon film in which an impurity such as a phosphorus is doped and a silicide film having a metal such a tungsten or a nickel. The control gate electrode CG is extended to the column direction as the word line WL.

The select gate electrodes SGD, SGS have a lower gate electrode corresponding to the floating gate electrode FG and an upper gate electrode corresponding to the control gate electrode CG. The select gate electrodes SGD, SGS have a inter-gate insulating film 4 located between the lower and the upper gate electrodes. The inter-gate insulating film 4 of the select gate electrodes SGD, SGS has an opening 4a and the lower gate electrode is directly connected to the upper gate electrode through the opening 4a.

Impurity diffusion layers 2c as source/drain regions are formed in the surface of the semiconductor substrate 2 between the memory cell electrodes MG, between the select gate electrodes SGD and the memory cell electrodes MG and between the select gate electrodes SGS and the memory cell electrodes MG. Impurity diffusion layers 2d are formed in the surface of the semiconductor substrate 2 located at a source side of the select gate electrodes SGS and located at a drain side of the select gate electrodes SGD. The impurity concentration of the impurity diffusion layers 2d is higher than the impurity concentration of the impurity diffusion layers 2c. A source line contact CS is formed on the impurity diffusion layers 2d of the side of the select gate electrode SGS. The source line contact CS is connected to the source line SL. A bit line contact CB is formed on the impurity diffusion layers 2d of the side of the select gate electrode SGD. The bit line contact CB is connected to the bit line (not shown) which is formed above the memory cell electrodes MG and the select gate electrodes SGD, SGS via an inter-layer insulating film (not shown).

Figure 4:
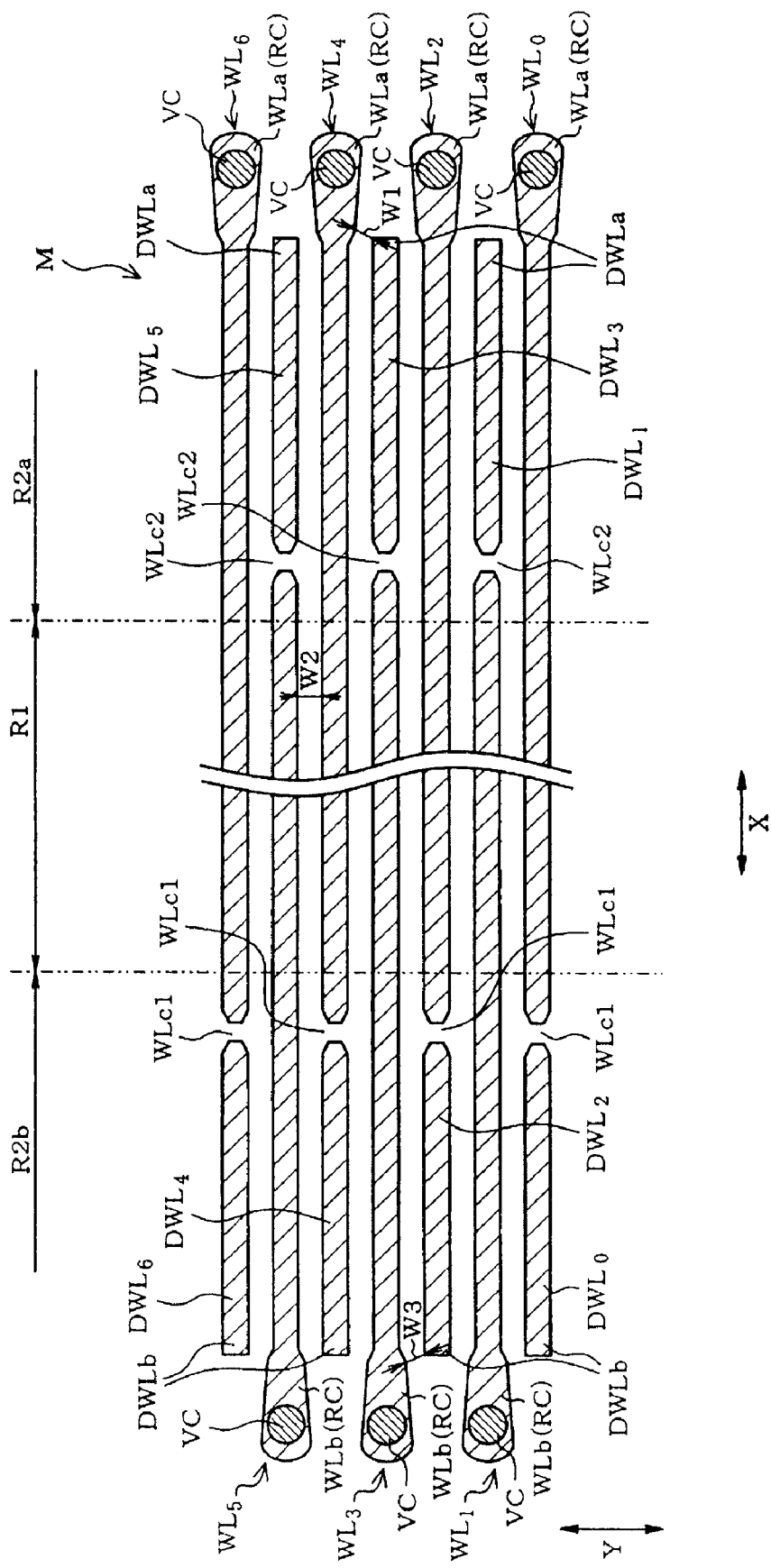
FIG. 4 is a plan view of word line structure according to a first embodiment.

FIG. 4 is a schematic plan view explaining structure of the word lines according to the first embodiment of the present invention. Each word line WL has a main word line portion which is located from the cell region R1 to one of the end regions R2a and R2b, and a dummy word line portion DWL which is located in the other of the end regions R2a and R2b. The dummy word line portion DWL is electrically separated from the main word line. The end of the main word line portion has a contact area RC which is located in one of the end regions R2a and R2b. The contact area RC is electrically connected to the main word line.

The even main word line portions WL0, WL2, WL4, WL6, . . . , WLm-2 have end portions WLa in the end region R2a. Each end portion WLa has the contact area RC in which a contact VC is formed. The odd main word line portions WL1, WL3, WL5, . . . , WLm-1 have end portions WLb in the end region R2b. Each end portion WLb has a contact area RC in which a contact VC is formed. In other words, the contact area RC are alternately located in the end regions R2a, R2b. Each contact area RC has a predetermined width which is lager than a width of the main word line portion WL in the cell region R1 along the direction Y. The contact VC has a predetermined diameter which is larger than the width of the main word line portion WL along the direction Y. Each main word line portion WL is connected through the contact VC to the transfer gate transistor (showed in FIG. 1).

The even main word line portions WL0, WL2, WL4, WL6, . . . , WLm-2 are separated from the dummy word line portions DWL0, DWL2, DWL4, DWL6, . . . , DWLm-2 at a dividing portions WLc1 which are located in the end regions R2b, respectively. The odd main word line portions WL1, WL3, WL5, . . . , WLm-1 are separated from the dummy word line portions DWL1, DWL3, DWL5, . . . , DWLm-1 at a dividing portions WLc2 which are located in the end regions R2a, respectively.

Each dummy word line portion DWL is located on an extension direction of the main word line portion WL and is always in floating condition that a voltage is not supplied. One end portion of the dummy word line portions DWL0, DWL2, DWL4, DWL6, . . . , DWLm-2 are located at the dividing portions WLc1. The other end portions DWLb of the dummy word line portions DWL0, DWL2, DWL4, DWL6, . . . , DWLm-2 are located near an end of the end portions WLb. In other words, the end portions WLb is projected outside the end portions DWLb along the direction X. The shortest distance W3 between the end portions DWLb of the dummy word line portions DWL0, DWL2, DWL4, DWL6, . . . , DWLm-2 and the end portions WLb is shorter than a distance W2 between an adjacent main word line portions along the direction Y.

One end portion of the dummy word line portions DWL1, DWL3, DWL5, . . . , DWLm-1 are located at the dividing portions WLc2. The other end portions DWLa of the dummy word line portions DWL1, DWL3, DWL5, . . . , DWLm-1 are located near an end of the end portions WLa. In other words, the end portions WLa is projected outside the end portions DWLa along the direction X. The shortest distance W1 between the end portions DWLa of the dummy word line portions DWL1, DWL3, DWL5, . . . , DWLm-1 and the end portions WLa is shorter than a distance W2 between an adjacent main word line portions along the direction Y.

FIG. 5 is a plan view showing an actual final configuration of a line and space pattern made experimentally. FIG. 6 is a plan view showing a design pattern corresponding to the line and space pattern shown in FIG. 5. FIG. 7 is a plan view showing a resist pattern corresponding to the design pattern shown in FIG. 6.

In FIG. 6, the design pattern has a plurality of line patterns D which are located in parallel. A length of a top line pattern is L1. A length of a second line pattern is L2 which is shorter than the length L1. A length of a third line pattern is L3 which is shorter than the length L2. A length of a fourth line pattern is L4 which is shorter than the length L3. A length of a bottom line pattern is L5 which is shorter than the length L4. That is, the line patterns D are designed so that it may be constituted short gradually (L1>L2>L3>L4>L5).

In FIG. 7, when a resist pattern R is formed from the design pattern D by photolithography method, end portions of the resist pattern R become narrow. This phenomenon occurs by an interference of the light and a diffraction of the light. The end portions of resist pattern R is narrower than an end of a photo mask on which the design pattern D is drawn.

When a reactive ion etching (RIE) process is performed with the resist pattern R, wide patterns are formed at edges of the line patterns P shown in FIG. 5. It is thought that the reason that the pattern becomes wide at the edge of the line pattern P is that a co-generator generated by the RIE process is easy to stagnate in a sparse region of the line pattern P and the edge is hard to be etched by the co-generator. In FIG. 5, a distance Wa between wide pattern portions is shorter than a distance Wb between the line patterns. A leak current generates between the wide pattern portions if a potential difference between adjacent line patterns P is large.

Next, a manufacturing method of the NAND-type flash memory according to the first embodiment will now be described. Firstly, a design pattern which has a plurality of rectangular shaped word lines extending along the predetermined direction is prepared. In design pattern, the end portions of the even word line patterns are located outward from the end portions of the odd word line patterns in one of the end regions and the end portions of the odd word line patterns are located outward from the end portions of the even word line patterns in the other of the end region. Next, a resist pattern is formed with the design pattern. Subsequently, word lines WL which has end portions WLa, WLb (shown in FIG. 4) are formed by the RIE process with the resist pattern. Next, the main word line portions WL0, WL2, WL4, WL6, . . . , WLm-2 are divided at the dividing portions WLc1 in the end region R2b and the main word line portions WL1, WL3, WL5, . . . , WLm-1 are divided at the dividing portion WLc2 in the end region R2a to form the dummy word line portions DWL by RIE process.

Next, a write operation of the NAND-type flash memory according to the first embodiment will be described with reference to FIG. 1 to FIG. 4.

In write operation, the peripheral circuits supply suitable voltages to the drive lines SD1, SG2, WDL0 to WDLm-1 and the bit lines BL0 to BLn-1. The address decoder circuit ADC supplies a select signal SEL to the charge pump circuit BS for selecting the memory block B in response to the external address signal S1. The charge pump circuit BS supplies a predetermined voltage to gate of the transfer gate transistor WTGD, WTGS, WT0 to WTm-1 of the transfer circuit WTB through the transfer gate line TG. Then various voltages of the drive lines SD1, SG2, WDL0 to WDLm-1 are supplied to the select line SGLD, SGLS and the word lines WL0 to WLm-1.

In the write operation, the peripheral circuits supply a low voltage (ex. 0V) to the p-type well region 2b, a high voltage (ex. 20V) to a selected word line WL and a middle voltage (ex. 10V) to non-selected word line WL. In accordance with the high voltage, a tunnel current flow from the semiconductor substrate 2 to the memory cell transistor MT of the selected word line WL through the gate insulating film 3, a charge is injected in the floating gate electrode FG and a threshold voltage of the memory cell transistor is shifted from low to high. A distance between the adjacent word lines WL tends to become narrow in accordance with a shrink of the memory. In this situation, a leak current increases between the selected and non-selected word lines WL.

According to the first embodiment, the influence of the leak current is restrained because the dummy word line portions DWL are located adjacent to the end portions WLa, WLB of the main word line portions WL. And a diameter of the contact VC is able to be formed largely and a contact resistance of the contact VC becomes small because the contact area RC is formed using the end portions WLa, WLb being formed widely in the sparse region. And a distance between the end portions WLa and between the end portions WLb is large because the end portions WLa of the main word line portions WL0, WL2, WL4, WL6, . . . , WLm-2 are formed in the end regions R2a and the end portions WLb of the main word line portions WL1, WL3, WL5, . . . , WLm-1 are formed in the end regions R2b. Then a short between the adjacent main word line portions WL is restrained even if a position of the contact VC is deviated.

Second Embodiment

Figure 8:
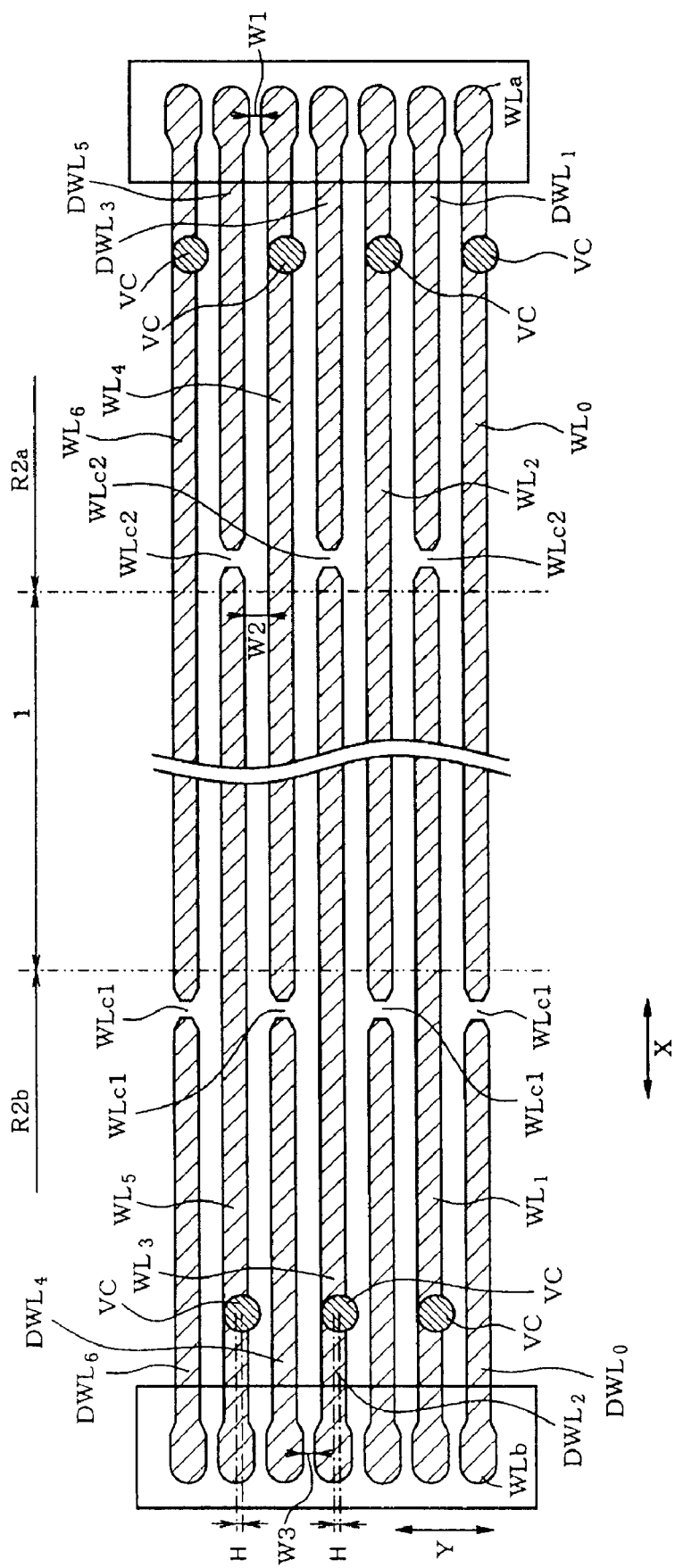
FIG. 8 is a schematic plan view explaining a manufacturing step of a word line structure according to the second embodiment.
Figure 9:
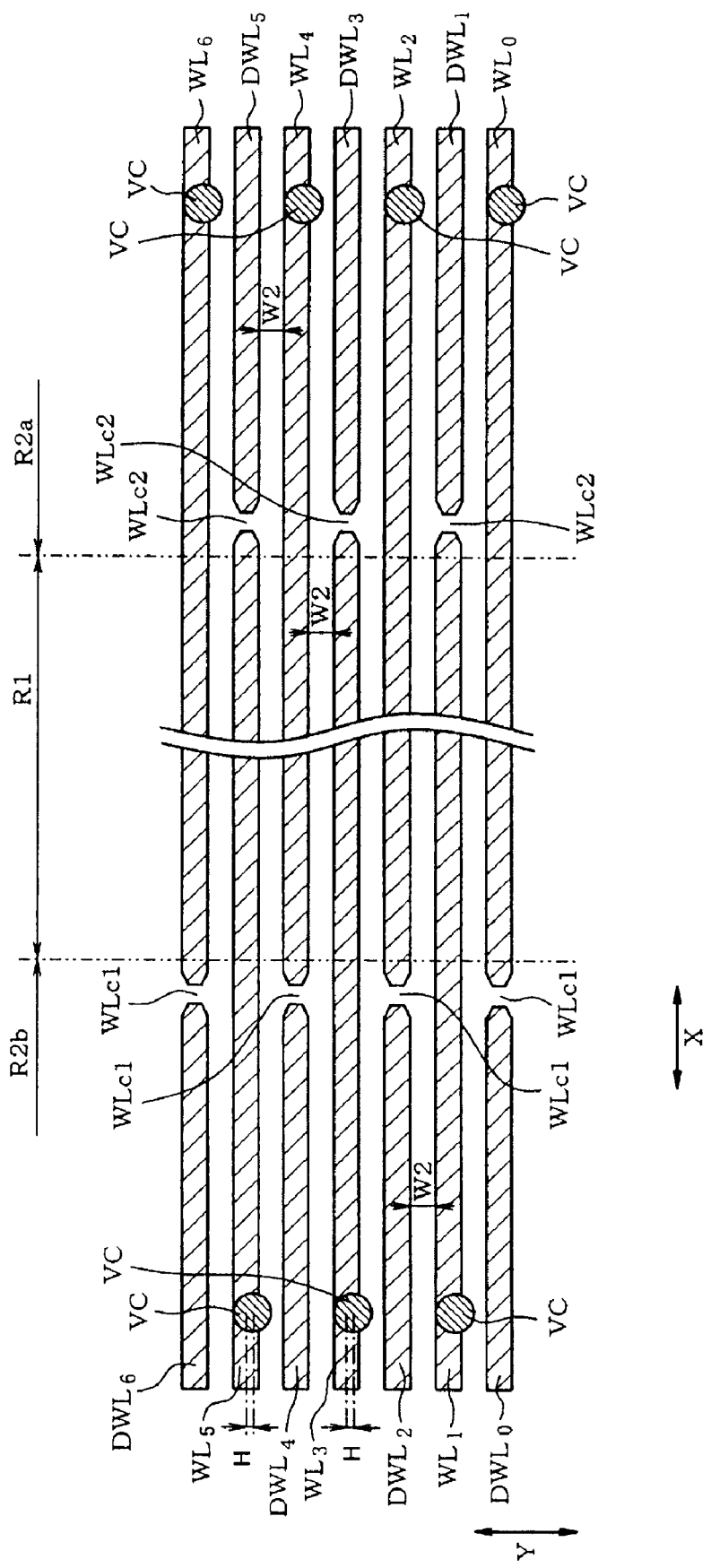
FIG. 9 is a schematic plan view explaining structure of the word line according to the second embodiment.

FIG. 8 is a schematic plan view explaining a manufacturing step of a word line structure according to the second embodiment. FIG. 9 is a schematic plan view explaining structure of the word line according to the second embodiment. Portions that are the same reference symbols and the detail explanation thereof is omitted.

In FIG. 8, one of the end portions of a dummy word line portions DWL1, DWL3, DWL5 and the end portion WLa of the main word line portions are located flatly each other in the end region R2a. And one of the end portions of a dummy word line portions DWL0, DWL2, DWL4, DWL6 and the end portion WLb of the main word line portions are located flatly each other in the end region R2b. A width of each end portion along the direction Y is larger than a width of the main word line portion WL located in the cell region R1. A distance W1 between the end portions in the end region R2a and a distance W3 between the end portions in the end region R2b are narrower than a distance W2 between the main word line portions WL in the cell region R1. If the distances W1, W3 are narrow, a leak current flows through a dummy word line portion DWL to the adjacent main word line portion WL. As shown in FIG. 9, according to the second embodiment, all end portions is removed to avoid the leak current.

The contacts VC are located on the main word line portions WL between the dummy word line portions DWL in the end regions R2a, R2b. The contact VC is formed so that a center of the contact VC shifts distance H from a center of the main word line portion WL. The contact VC connected to the main word line portion WL at an upper and a side surfaces thereof to decrease of the contact resistance between the contact VC and the main word line portion WL.

The present invention can be also applied to other semiconductor device such as an NOR-type flash memory, a DRAM or an MONOS flash memory that uses a silicon nitride film as a charge storage layer in place of a floating gate electrode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device including a plurality of memory cell transistors, comprising:
    a semiconductor substrate including a first and a second end regions and a cell region located between the first and the second end regions, the memory cell transistors located in the cell region;
    a first word line located from the first end region to the second end region through the cell region along a predetermined direction, the first word line including a first main word line portion located from the cell region to the first end region and a first dummy word line portion located in the second end region along an extension direction of the first main word line portion, a first end of the first dummy word line portion located near a second end of the first main word line portion via a first dividing portion located in the second end region;
    a second word line located adjacent to the first word line from the first end region to the second end region through the cell region in parallel with the first word line, the second word line including a second main word line portion located from the cell region to the second end region and a second dummy word line portion located in the first end region along an extension direction of the second main word line portion, a third end of the second dummy word line located adjacent to a fourth end of the second main word line portion via a second dividing portion located in the first end region;
    a first contact located in the first end region and electrically connected to the first main word line portion; and
    a second contact located in the second end region and electrically connected to the second main word line portion.

2. The device according to claim 1, wherein the first main word line portion includes a first end portion opposite to the second end in the first end region, the second main word line portion includes a second end portion opposite to the fourth end in the second end region, the first contact is located on the first end portion and the second contact is located on the second end portion.

3. The device according to claim 2, wherein the first dummy word line portion includes a fifth end opposite to the first end, the second dummy word line portion includes a sixth end opposite to the third end, the first end portion of the first main word line portion is located outward to the sixth end of the second dummy word line portion along the predetermined direction, and the second end portion is located outward to the first dummy word line portion along the predetermined direction.

4. The device according to claim 3, wherein the first and second end portions include a first width being larger than a second width of the first main word line portion located in the cell region along a direction which is perpendicular to the predetermined direction.

5. The device according to claim 1, wherein the first contact is located adjacent to the second dummy word line portion along a perpendicular direction which is perpendicular to the predetermined direction, and the second contact is located adjacent to the first dummy word line portion along the perpendicular direction.

6. The device according to claim 1, wherein a center of the first contact is shifted from a center of the first main word line portion, and a center of the second contact is shifted from a center of the second main word line portion.

7. The device according to claim 6, wherein the first contact is connected to the first main word line portion at an upper surface and a side surface of the first main word line portion, and the second contact is connected to the second main word line portion at an upper surface and a side surface of the second main word line portion.

8. The device according to claim 1, wherein the semiconductor substrate includes an active area located along a direction which is perpendicular to the predetermined direction, a charge storage layer of the memory cell transistor is located between the active area and the first and the second word line in the cell region.

9. The device according to claim 8, wherein the charge storage layer includes a floating gate electrode.

* * * * *